(12) United States Patent
Ogusu

(10) Patent No.: US 7,768,625 B2
(45) Date of Patent: Aug. 3, 2010

(54) PHOTO DETECTOR UNIT AND EXPOSURE APPARATUS HAVING THE SAME

(75) Inventor: Makoto Ogusu, Shimotsuke (JP)

(73) Assignee: Canon Kabushiki Kaisha, Tokyo (JP)

( * ) Notice: Subject to any disclaimer, the term of this patent is extended or adjusted under 35 U.S.C. 154(b) by 313 days.

(21) Appl. No.: 11/438,348

(22) Filed: May 23, 2006

(65) Prior Publication Data

US 2006/0274297 A1 Dec. 7, 2006

(30) Foreign Application Priority Data

Jun. 2, 2005 (JP) ............................. 2005-162946

(51) Int. Cl.
*G03B 27/42* (2006.01)
(52) U.S. Cl. .................. 355/53; 257/433; 257/434; 257/435; 257/436; 257/437; 355/67; 355/72
(58) Field of Classification Search ............ 355/53, 355/71, 72; 356/400; 257/680, 431–437
See application file for complete search history.

(56) References Cited

U.S. PATENT DOCUMENTS

| | | | | |
|---|---|---|---|---|
| 4,443,096 A | * | 4/1984 | Johannsmeier et al. ....... 355/53 |
| 4,675,525 A | * | 6/1987 | Amingual et al. ........ 250/338.1 |
| 4,760,440 A | * | 7/1988 | Bigler et al. ................ 257/680 |
| 4,814,620 A | * | 3/1989 | Comey et al. ............... 250/352 |
| 5,150,180 A | * | 9/1992 | Yama ........................ 257/680 |
| 5,254,480 A | * | 10/1993 | Tran ............................. 438/59 |
| 5,352,852 A | * | 10/1994 | Chun ........................ 174/533 |
| 5,867,368 A | * | 2/1999 | Glenn ........................ 361/783 |
| 6,008,942 A | | 12/1999 | Ogusu et al. ................ 359/571 |
| 6,396,116 B1 | * | 5/2002 | Kelly et al. ................. 257/432 |
| 6,661,084 B1 | * | 12/2003 | Peterson et al. ............ 257/680 |
| 6,829,091 B2 | | 12/2004 | Kato et al. .................. 359/569 |
| 6,940,587 B2 | * | 9/2005 | Van Der Laan et al. ....... 355/67 |
| 6,952,253 B2 | | 10/2005 | Lof et al. ...................... 355/30 |
| 7,075,616 B2 | | 7/2006 | Derksen et al. ............... 355/30 |
| 7,081,943 B2 | | 7/2006 | Lof et al. ...................... 355/30 |
| 7,110,081 B2 | | 9/2006 | Hoogendam et al. .......... 355/30 |

(Continued)

FOREIGN PATENT DOCUMENTS

EP 1 420 298 A2 5/2004

(Continued)

OTHER PUBLICATIONS

Japanese Office Action dated Jun. 23, 2009, issued in corresponding Japanese patent application No. 2005-162946.

*Primary Examiner*—Hung Henry Nguyen
*Assistant Examiner*—Steven H Whitesell-Gordon
(74) *Attorney, Agent, or Firm*—Fitzpatrick, Cella, Harper & Scinto

(57) ABSTRACT

An exposure apparatus includes (a) a projection optical system to project a reticle pattern onto a plate by using a light from a light source, and (b) a photo detector unit to detect the light via the projection optical system. The photo detector unit includes (i) a substrate, which is patterned with a wiring pattern and transmits the light, (ii) a detector to detect the light, and (iii) a bump to space the substrate from the detector, and to electrically connect the detector and the wiring pattern of the substrate.

6 Claims, 10 Drawing Sheets

U.S. PATENT DOCUMENTS

| | | |
|---|---|---|
| 7,193,232 B2 | 3/2007 | Lof et al. .................... 250/548 |
| 7,199,858 B2 | 4/2007 | Lof et al. ..................... 355/30 |
| 7,213,963 B2 | 5/2007 | Lof et al. ..................... 366/53 |
| 7,224,436 B2 | 5/2007 | Derksen et al. ............... 355/53 |
| 7,352,434 B2 | 4/2008 | Streefkerk et al. ........... 355/53 |
| 7,368,695 B2 * | 5/2008 | Kang et al. ............... 250/208.1 |
| 7,372,541 B2 | 5/2008 | Lof et al. ..................... 355/53 |
| 7,378,748 B2 * | 5/2008 | Shimizu et al. ............. 257/787 |
| 7,388,648 B2 | 6/2008 | Lof et al. ..................... 355/53 |
| 7,482,611 B2 | 1/2009 | Lof et al. .................... 250/548 |
| 2003/0156268 A1 * | 8/2003 | Nagasaka et al. ............ 355/69 |
| 2005/0078287 A1 | 4/2005 | Sengers et al. ................ 355/30 |
| 2005/0264778 A1 | 12/2005 | Lof et al. ..................... 355/53 |
| 2006/0268250 A1 | 11/2006 | Derksen et al. ............... 355/53 |
| 2006/1027429 | 12/2006 | Ogusu ........................ 355/71 |
| 2007/0132970 A1 | 6/2007 | Lof et al. ..................... 355/53 |
| 2007/0132971 A1 | 6/2007 | Sengers et al. ................ 355/53 |
| 2007/0268471 A1 | 11/2007 | Lof et al. ..................... 355/53 |
| 2008/0218717 A1 | 9/2008 | Streefkerk et al. ........... 355/53 |
| 2008/0218726 A1 | 9/2008 | Lof et al. ..................... 355/72 |
| 2009/0002652 A1 | 1/2009 | Lof et al. ..................... 355/30 |
| 2009/0184270 A1 | 7/2009 | Lof et al. .................... 250/548 |

FOREIGN PATENT DOCUMENTS

| | | |
|---|---|---|
| EP | 1 420 299 A2 | 5/2004 |
| EP | 1 420 300 A2 | 5/2004 |
| EP | 1 429 188 A2 | 6/2004 |
| EP | 1 477 856 A1 | 11/2004 |
| EP | 1 486 828 A2 | 12/2004 |
| EP | 1 510 870 A1 | 3/2005 |
| JP | 2-88372 | 7/1990 |
| JP | 2003-031467 | 1/2003 |
| JP | 2004-251764 | 9/2004 |
| JP | 2005-79587 | 3/2005 |
| WO | WO 2005/031799 A2 | 4/2005 |

* cited by examiner

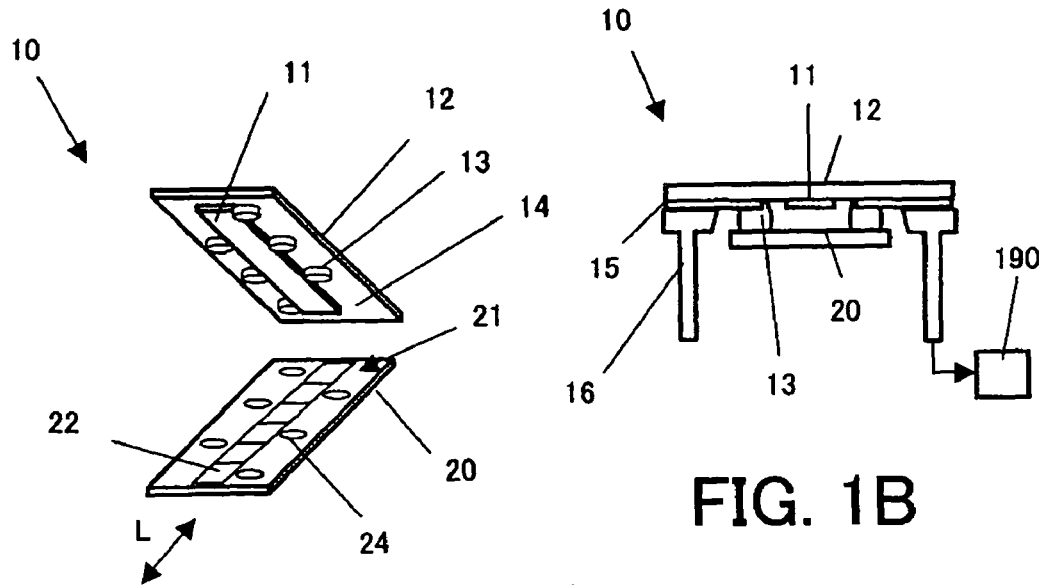
FIG. 1A
FIG. 1B
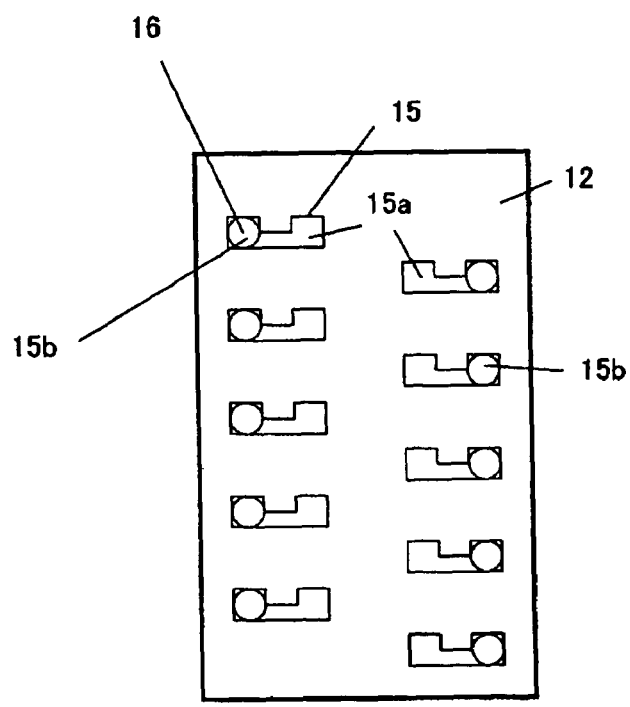
FIG. 1C

PHOTO DETECTOR UNIT AND EXPOSURE APPARATUS HAVING THE SAME

This application claims foreign priority benefit based on Japanese Patent Application No. 2005-162946, filed on Jun. 2, 2005, which is hereby incorporated by reference herein in its entirety as if fully set forth herein.

BACKGROUND OF THE INVENTION

The present invention relates generally to a photo detector unit, and, more particularly, to a photo detector unit that detects light in a so-called immersion exposure apparatus, which fills a liquid or fluid in a space between a final surface of a projection optical system and a surface of a plate to be exposed, and exposes the plate via the projection optical system and the liquid using light from a light source.

A conventional projection exposure apparatus projects a circuit pattern of a reticle (mask) onto a wafer or another plate via a projection optical system. A high-resolution and high-quality exposure apparatus has recently been increasingly demanded.

The immersion lithography is one attractive means that satisfies the high-resolution demand. The immersion lithography promotes an increased numerical aperture ("NA") by replacing a medium (typically, air) at the wafer side of the projection optical system with the liquid. The NA of the projection optical system is defined as $NA = n \cdot \sin\theta$, where n is a refractive index of the medium. The NA increases up to n when the medium has a refractive index higher than the refractive index of air, i.e., n>1. Thus, the immersion lithography can reduce a resolution R of the exposure apparatus, which is defined as $R = k_1 (\lambda/NA)$, where $k_1$ is a process constant, and $\lambda$ is a wavelength of a light source.

On the other hand, high-quality exposure requires measurements of the exposure dose, light intensity distribution, and the physical quantity of the optical performance of the projection optical system, such as a wavefront aberration, and necessary adjustments based on the measurement result. In addition, the immersion exposure apparatus requires measurements through the liquid. In this case, a photo detector, which is typically made of a semiconductor device, is vulnerable to the humidity and, thus, should be isolated from the liquid. One conceivable protection of isolating the photo detector from the liquid is to use a light transmitting window. Since the photo detector cannot bring its photosensitive surface into contact with the window due to its uneven surface and mounted wiring, such as wires, an air gap is inevitable between the window and the photosensitive surface. The photo detector used for the immersion exposure apparatus needs to receive the light having an NA greater than one, which cannot reach the photo detector due to the air gap.

The prior art includes Japanese Patent Application, Publication No. 2005-79587, which proposes a sensor that includes a photo-diode (photocell) and a fluorescent substance (luminescence layer), as shown in FIG. 16. This reference teaches to insert a light transmitting filler sheet, and to introduce the light to the fluorescent substance without loss. Other conventional photo detector units are proposed in Japanese Patent Applications, Publication Nos. 2003-031467 and 2004-251764.

However, Japanese Patent Application, Publication No. 2005-79587, merely expects a damped-wave tunneling effect, and does not provide any specific solution to the light having an NA of one or greater. This reference cannot measure all the doses or provide a highly precise measurement. Japanese Patent Applications, Publication Nos. 2003-031467 and 2004-251764, do not contemplate an immersion exposure apparatus, and cause the characteristics of the photo detector to deteriorate, because the photo detector contacts the liquid when the photo detector is applied to the immersion exposure apparatus.

BRIEF SUMMARY OF THE INVENTION

The present invention is directed to a photo detector unit for precisely and stably detecting light having an NA greater than one, and an immersion exposure apparatus having the same.

An exposure apparatus according to one aspect of the present invention includes a projection optical system configured to project a reticle pattern onto a plate by using light from a light source, a liquid being filled in a space between the projection optical system and the plate, so that the plate is exposed through the projection optical system and the liquid, and a photo detector unit configured to detect the light via the projection optical system and the liquid, wherein the photo detector unit includes a diffuser configured to diffuse the light, a detector configured to detect the light that has been diffused by the diffuser, and a substrate configured to prevent the liquid from contacting the detector, and to introduce the light to the diffuser.

An exposure apparatus according to another aspect of the present invention includes a projection optical system configured to project a reticle pattern onto a plate by using light from a light source, a liquid being filled in a space between the projection optical system and the plate, so that the plate is exposed through the projection optical system and the liquid, and a photo detector unit configured to detect the light via the projection optical system and the liquid, wherein the photo detector unit includes one of a fluorescent substance that emits a fluorescence in accordance with an intensity of the light, and a diffuser configured to diffuse the light, a detector configured to detect the fluorescence of the light that has been diffused by the diffuser, a substrate configured to prevent the liquid from contacting one of the fluorescent substance and the detector, and to introduce the light to one of the fluorescent substance and the diffuser, and a bump configured to space one of the fluorescent substance and the diffuser from the detector, and being electrically connected to the detector.

An exposure apparatus according to still another aspect of the present invention includes a projection optical system configured to project a reticle pattern onto a plate by using light from a light source, a liquid being filled in a space between the projection optical system and the plate, so that the plate is exposed through the projection optical system and the liquid, and a photo detector unit configured to detect the light via the projection optical system and the liquid, wherein the photo detector unit includes a diffuser configured to diffuse the light, a detector configured to detect the light that has been diffused by the diffuser, and a first substrate made of a material that transmits the light and is configured to prevent the liquid from contacting the detector, the first substrate including a light shielding part that shields the light and a light transmitting part that transmits the light, and wherein the detector detects an interferogram that is formed by the light that transmits through the projection optical system and the light transmitting part.

Other objects and further features of the present invention will become readily apparent from the following description of the preferred embodiments with reference to the accompanying drawings.

BRIEF DESCRIPTION OF THE DRAWINGS

FIG. 1A is a schematic perspective view of an inventive photo detector unit.

FIG. 1B is a schematic sectional view of the photo detector unit shown in FIG. 1A. FIG. 1C is a plan view of a substrate shown in FIG. 1A.

DETAILED DESCRIPTION OF THE PREFERRED EMBODIMENTS

Figure 2:
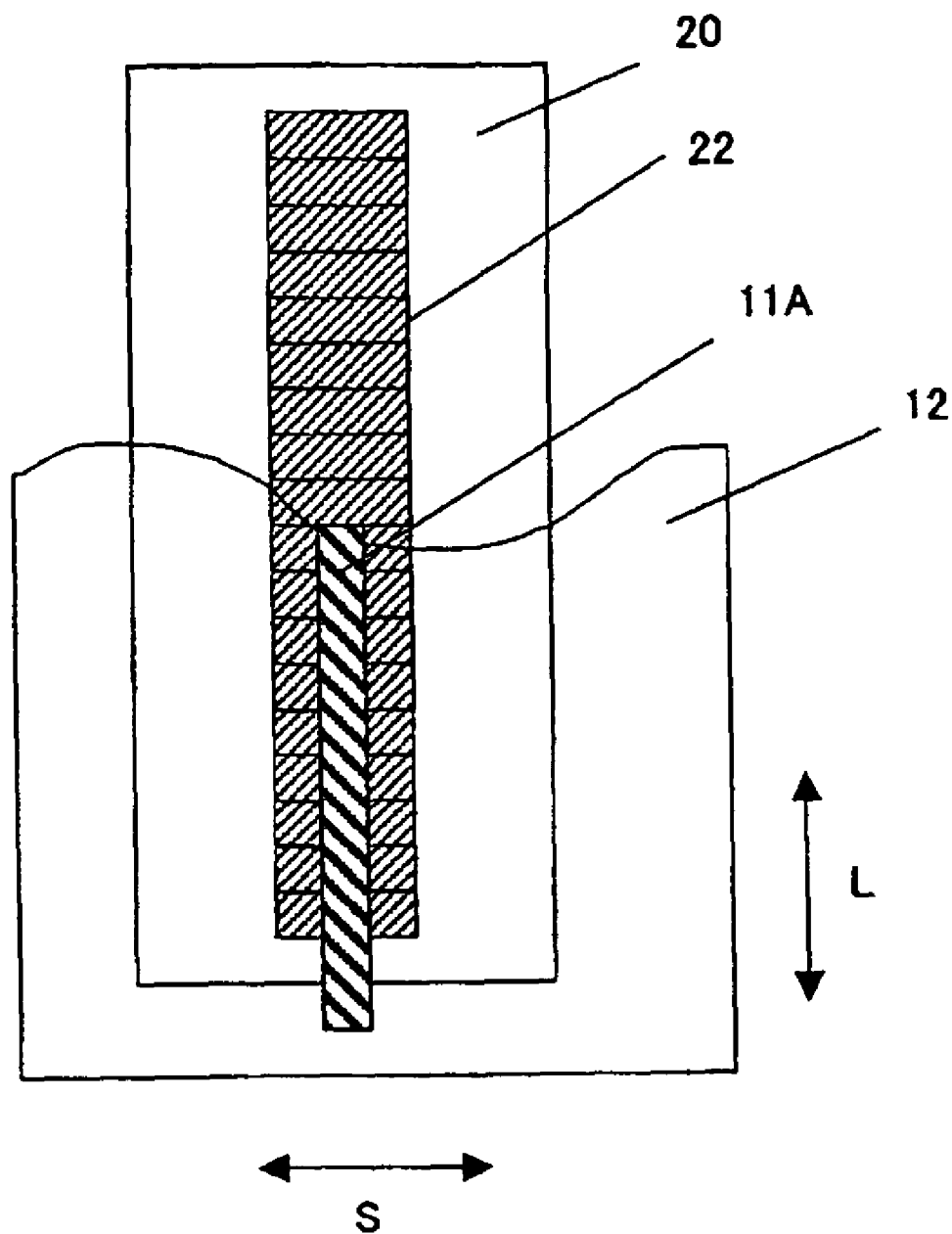
FIG. 2 is a schematic partial transparent plan view of a variation of the photo detector unit shown in FIGS. 1A-1C.

Referring now to the accompanying drawings, a description will be given of a photo detector unit 10, according to one aspect of the present invention, and an exposure apparatus 100 having the same. Those elements, which are the same as corresponding elements in each figure, are designated by the same reference numerals, and a duplicate description thereof will be omitted.

Figure 6:
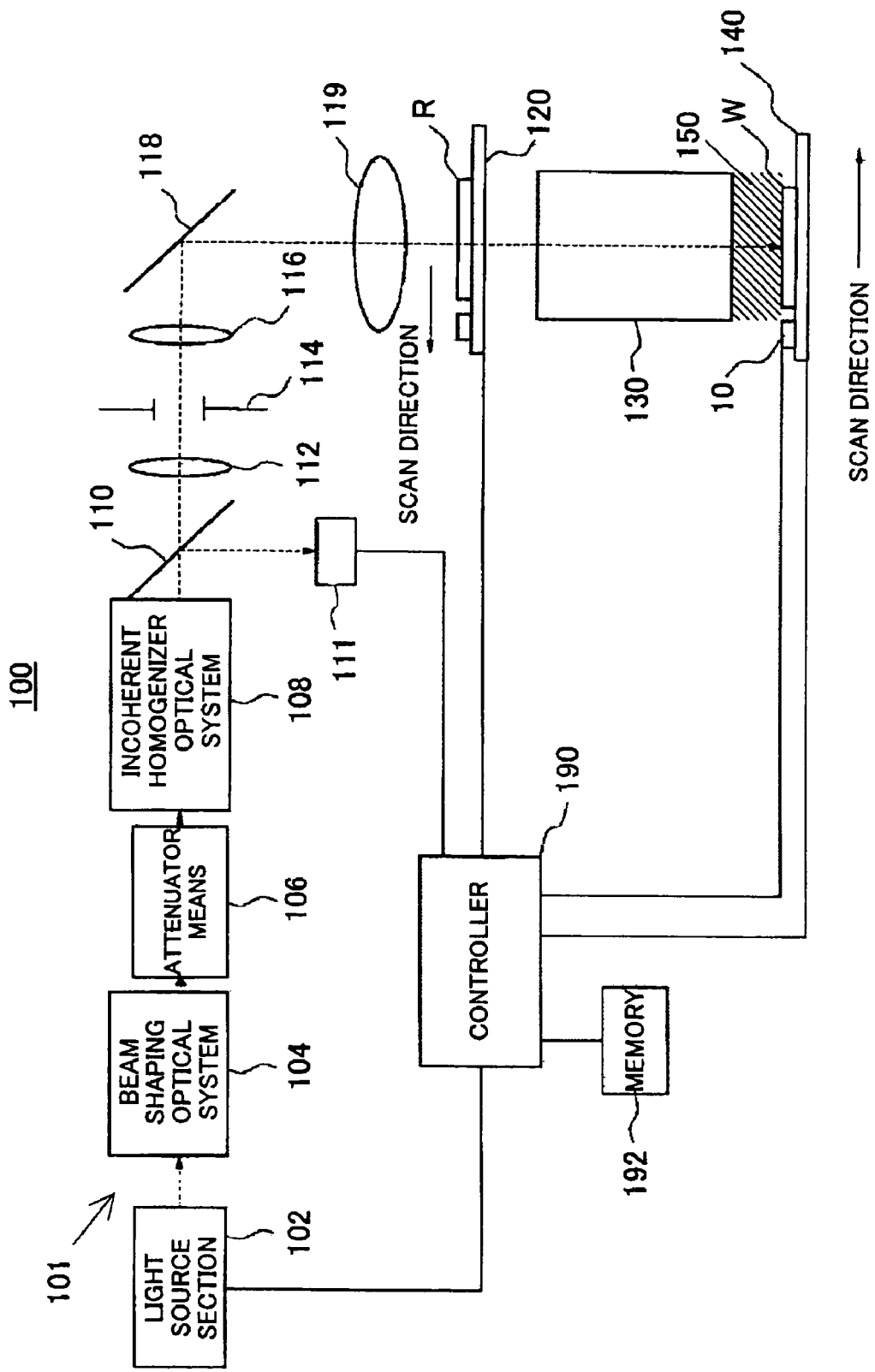
FIG. 6 is a schematic block diagram of an exposure apparatus to which the photo detector unit shown in FIGS. 1A to 1C is applicable.

Referring now to FIG. 6, a description will be given of an embodiment of the exposure apparatus 100 mounted with the photo detector unit 10 that serves as a line sensor. FIG. 6 is a schematic block diagram of the exposure apparatus 100. The exposure apparatus 100 includes an illumination apparatus, a reticle stage 120 that supports and drives a reticle R, a projection optical system 130, a wafer stage 140 that supports and drives a wafer W, and a control system (190, 192). The exposure apparatus 100 is an immersion exposure apparatus that partially or wholly immerses, in a liquid 150, a final surface of the projection optical system 130 at the wafer W side, and exposes a pattern of the reticle R onto a wafer W. While the exposure apparatus 100 of this embodiment is a step-and-scan type projection exposure apparatus (i.e., a so-called scanner), the present invention is also applicable to a step-and-repeat type or another type of exposure system.

The illumination apparatus illuminates the reticle R, on which a circuit pattern to be transferred is formed. The illumination apparatus includes a light source section 102 and an illumination optical system.

The light source section 102 uses, for example, a pulsed laser. The pulsed laser can use, for example, an ArF excimer laser with a wavelength of approximately 193 nm, a KrF excimer laser with a wavelength of approximately 248 nm, and an $F_2$ laser with a wavelength of approximately 157 nm. The laser type and the number of lasers are not limited, and a type of the light source section is also not limited. The illumination optical system is an optical system that introduces light from the light source section 102 to the reticle R, and includes elements 102 to 119, in this embodiment.

Reference numeral 104 denotes a beam shaping optical system, such as a cylindrical lens and a beam expander, which shapes the pulsed light oscillated from the pulsed light source 102. Reference numeral 106 denotes an attenuator means, such as an ND filter, which adjusts the intensity of the pulsed light oscillated from the light source section 102. Reference numeral 108 denotes an incoherent homogenizer optical system, which reduces the coherency of the pulsed light from the light source section 102, and uniformly illuminates the reticle R.

Reference numeral 110 denotes a beam splitter, which introduces part of the pulsed light to a photo detector 111, and allows most of the pulsed light to pass through it. Reference numeral 112 denotes a first relay lens, which uniformly illuminates a field stop 114 that is conjugate with a photosensitive surface of the photo detector 111. Reference numeral 114 denotes a field stop, which narrows and turns the light into a rectangular shape. Reference numeral 116 denotes a second relay lens, reference numeral 118 denotes a mirror, which deflects the optical path, and reference numeral 119 denotes a condenser lens. The optical elements 116 to 119 uniformly illuminate the reticle R, and the field stop 114 is conjugate with the reticle R. In actual exposure, the reticle R has a pattern to be transferred. On the other hand, in measuring the light intensity distribution of the illumination area and the exposure dose distribution in the exposure area, this embodiment installs the reticle that has no pattern onto the reticle stage 120 or removes the reticle R. Reference numeral 130 denotes a projection optical system that projects a reduced pattern of the actual reticle R onto the wafer W.

Reference numeral 140 denotes a wafer stage that supports the wafer W. The liquid 150 is made of a material that has a high transmittance to the exposure wavelength, matches the resist process, and does not contaminate the projection optical system 130. The liquid 150 is made of a material having a refractive index greater than one, to increase the NA of the projection optical system 130.

Reference numeral 10 denotes an illumination meter (photo detector unit) that measures the light intensity distribution in the illumination area, and the exposure dose distribution in the exposure area. The illumination meter 10 includes plural photo detectors 22 that are linearly arranged in the scan direction on the light receiving part. The illumination meter 10 is installed on the wafer stage 140, so that the light receiving part is level with the wafer plane. Reference numeral 190 denotes a controller that receives an output of and operates the photo detector 111 and the illumination meter 10, controls the reticle stage 120 and the wafer stage 140, and controls the emitting timing of the pulsed light source 102. Reference numeral 192 denotes a memory that stores data of the controller 190.

In measuring the light intensity distribution of the illumination area using the above structure, the controller 190 controls a position of the wafer stage 140 so that the photo detectors 22 in the illumination meter 10 cover a length of the illumination area in the scan direction, and then, the controller 190 allows the pulsed light source 102 to emit the light. The controller 190 reads out of the memory 192 a correction coefficient of the sensitivity scattering among photo detectors 22, divides it by the measured value of the corresponding photo detector 22, and removes the influence of the sensitivity scattering among the photo detectors 22 on the measurement value. The calculation of the correction coefficient will be described later. Thus, measurement values are obtained as a light intensity distribution of the illumination area in the scan direction from the photo detectors 22 that are linearly arranged in the scan direction. In addition, the light intensity distribution of the entire illumination area is given by repeating the above measurements by moving the illumination meter 10 in a direction orthogonal to the scan direction (referred to as a "sub-scan direction" hereinafter).

In measuring the exposure dose distribution of the exposure area in the scan direction, the controller 190 also stops the wafer stage 140 at a scan start position, so that the photo detectors 22 of the illumination meter 10 can cover the length of the exposure area in the scan direction. The controller 190 scans the wafer stage 140, allows the light source section 102 to emit light, and performs exposure for the illumination meter 10. In exposure, the controller 190 integrates output values of photo detectors 22 in the illumination meter 10 for each pulse. After the exposure ends, the controller 190 reads out of the memory 192 the correction coefficient of the sensitivity scattering among the photo detectors 22, divides it by the measured value of the corresponding photo detector 22, and removes the influence of the sensitivity scattering among the photo detectors 22 on the measurement value. Thus, measurement values are obtained as an exposure dose distribution of the exposure area in the scan direction from the photo detectors 22 that are linearly arranged in the scan direction.

The light receiving unit 10 may be a CCD line sensor or a photo-diode array. The photo detector 22 may be a pixel of the CCD or a photo-diode. The light receiving unit 10 in this embodiment uses one that has a length of 30 mm or greater in the scan direction. For a sufficient resolution of the exposure dose distribution, a conceivable interval of the photo detector is about 20 μm, and a width is 20 μm in the sub-scan direction. The photo detectors 22 may be linearly arranged in the scan direction, or two-dimensionally arranged in both the scan direction and the sub-scan direction.

A detailed description will be given of the light receiving unit 10. FIG. 1A is an exploded perspective view of the light receiving unit 10. FIG. 1B is a schematic sectional view of the light receiving unit 10. FIG. 1C is a plan view of a wiring pattern 15 formed on a substrate 12. For description purposes, FIG. 1A omits the wiring pattern 15 and the electrode 16 depicted in FIG. 1B. In addition, FIG. 1C circles a connecting part 15b of the wiring pattern 15 with the electrode 16. As shown in FIGS. 1A-1C, the light receiving unit 10 includes a fluorescent substance 11, a substrate 12, a plurality of bumps 13, a reflector or an absorber film 14, a wiring pattern 15, an electrode 16, and a photo detector package 20.

The fluorescent substance 11 is arranged just above photo detectors (light receiving pixels) 22 on the photo detector package 20, and has a rectangular shape similar to the light receiving pixel 22. The fluorescent substance 11 extends in one direction in FIG. 1A, such as the scan direction, for simultaneous wavelength conversions of all the incident lights in the one direction. The fluorescent substance 11 serves as a (pseudo-) secondary light source that generates the fluorescence in accordance with the incident light intensity, and may use, for example, Lumogen® (Hama Photography), and Lumilus® (Sumita Optical Glass, Inc.). The fluorescence is irrelevant to the NA of the incident light, and has an emitting point at a position absorbed in the fluorescent substance 11. When light having an NA greater than one is incident upon the fluorescent substance 11, the fluorescent substance 11 emits the fluorescence in a direction different from the incident direction.

In adjusting an excessively large output from the photo detector package 20, the fluorescent substance 11 is made small. In addition, the incident light intensity upon the photo detector package 20 needs to be adjusted by shielding a part other than the fluorescent substance 11, or by using the pattern on the light incident plane of the substrate 12, to prevent the light from entering a part other than the fluorescent substance 11. A detailed description will be given below of the way of setting the area of the fluorescent substance 11.

The substrate 12 is a plate made of a light transmitting material that transmits the incident light, and introduces the incident light to the fluorescent substance 11. The substrate 12 is made of a material, such as quartz, which does not absorb the incident light without contaminating the liquid 150. The substrate 12 prevents the liquid 150 from contacting the fluorescent substance 11, and from deteriorating the characteristic of the fluorescent substance 11.

The bumps 13, which are made of a metallic material, such as a soldering ball, have a first function as a spacer that spaces the light receiving pixels 22 from the fluorescent substance 11, and a second function that transmits information detected by the photo detector package 20 to an external terminal (not shown). While this embodiment implements the inventive structure using the bumps, the present invention may use an electrical conductive adhesive agent. The electrical conductive characteristic assures an electrical connection, and the agent does not require heating, unlike soldering, in assembly, thus reducing the influence on the fluorescent substance and the photo detector package.

A photosensitive surface 21 of the photo detector package 20, which will be described later, and a CCD 26 of the photo detector package 20A, which will be described with reference to FIGS. 5A-5C, cannot contact the substrate 12 or 12A (generalized by reference numeral "12" hereinafter). This is because the photosensitive surface 21 has an uneven surface, and the photo detector package 20A has wiring (such as bonding wires 26). Therefore, an air gap exists between the substrate 12 and the photo detector package 20 or 20A (generalized by reference numeral "20" hereinafter). This air gap prevents the light having an NA greater than one from reaching and, thus, being detected by the photo detector package 20 in the immersion exposure apparatus 100. Accordingly, this embodiment converts the wavelength of the incident light using the fluorescent substance 11, and introduces the fluorescence to the photo detector package 20. As a distance between the fluorescent substance 11 and the photo detector package 20 becomes large, the spatial information is lost. The bumps 13 maintain the distance to be small. Thus, the first function of the bump 13 is to maintain the air gap necessary for the uneven surface and the wiring of the photo detector package 20, and to minimize the air gap for detection precision.

For the first function, the bumps 13 are arranged at regular intervals at both sides of the fluorescent substances 11 in the longitudinal direction L of the fluorescent substance 11, as shown in FIG. 1A. For the second function, as shown in FIG. 1B, the bump 13 is connected to the wiring pattern 15 at one end thereof; and to an electrode pad 24 at the other end thereof. Part of the bumps 13 may be arranged on the substrate 12 outside the wiring pattern 15. Each bump 13 opposes the electrode pad 24. While this embodiment forms the bump 13 at the substrate 12 side, they may be exchanged. The bump 13 provides an electrical connection and a mechanical fixture, maintains the spatial resolution, and reduces the distance between the fluorescent substance 11 and the photo detector package 20.

The reflector or absorber film 14 is arranged around the fluorescent substance 11 and the bumps 13 on the same surface as that of the fluorescent substance 11. However, for reflection or absorption purposes, the film 14 may be formed at either surface. The light receiving unit 10 uses the absorber film for the film 14. The film 14 prevents unnecessary light, such as exposure light, from reaching the light receiving pixel 22. The influence of the exposure light would be negligible when the photo detector package 20 is sensitive only to the fluorescence and insensitive to the incident light upon the fluorescent substance 11. However, if the film 14 is provided, it furnishes an improved detection accuracy effect by preventing the fluorescence that is reflected on the surface of the photo detector package 20 and, then, on the substrate 12 from reaching the adjacent light receiving pixel 22. The reflector film is more effective in order to prevent the fluorescence from transmitting the substrate 12 and from returning or, in addition to this, in order to prevent the temperature changes when the substrate 12 absorbs the fluorescence.

The wiring pattern 15 is patterned on the same surface as that of the bumps 13 of the substrate 12, as shown in FIG. 1C. In FIG. 1C, each wiring pattern 15 is connected to the bump 13 at the connecting part 15a, and connected to an electrode 16 at its connecting part 15b. The electrode 16 is connected to the connecting part 15b of the wiring pattern 15 at one end thereof, and a controller or an operating part of the measuring apparatus, and the controller 190 at the other end thereof. As a result, information detected by the photo detector package 20 in the light receiving unit 10 is transmitted to the controller 190 via the bumps 13, the wiring pattern 15 and the electrode 16. Instead of the wiring patterns 15, the bumps 13 may be connected to the electrodes 16 through other means, such as a wire.

The photo detector package 20 includes a plurality of light receiving pixels 22, and a plurality of electrode pads 24. The photo detector package 20 may further include, if necessary, an operating circuit that operates the fluorescent intensity, the intensity of the light incident upon the fluorescent substance 11, etc., as to the lights received by the light receiving pixels 22.

The light receiving pixels 22 receive the fluorescence from the fluorescent substance 11, and their plane forms a sensor photosensitive surface 21. The light receiving pixels 22 are disposed below the fluorescent substance 11 parallel to the longitudinal direction L of the fluorescent substance 11. The resultant lights received by the light receiving pixels 22 are transmitted to the electrode pad 24 directly or via a circuit (not shown) in the photo detector package 20. The photo detector package 20 detects the fluorescent intensity and intensity distribution from the detection results of the light receiving pixels 22. If needed, the photo detector package 20 may convert the detection results of the light receiving pixels 22 into the intensity or intensity distribution of the incident light upon the fluorescent substance 11. The detection result of the photo detector package 20 is transmitted to the controller 190 via the electrode pads 24. The photo detector package 20 may be implemented as an illumination meter that has a photoelectric converter element or an image pickup device, such as a CCD, which takes an image of the light intensity distribution.

The electrode pads 24 transmit the detection results of the light receiving pixels 22 to the bumps 13. The electrode pads 24 alternate with respect to the longitudinal direction L at one side of each light receiving pixel 22, as shown in FIG. 1A. If the electrode pads 24 are formed only at the same single side of the light receiving pixels 22 in the longitudinal direction L, then no bumps 13 stand at the non-formed side, failing to provide the first function (or spacer function).

In assembly, the fluorescent substance 11 and the bumps 13 are provided on the substrate 12, and the light receiving pixels 22 and the electrode pads 24 are provided on the photo detector package 20. The light receiving unit 10 is assembled by fusing the bumps 13 onto the electrode pads 24. The light receiving unit 10 is a one-dimensional light receiving unit, in which the light receiving pixels 22 are arranged in the L direction, and measures the light intensity distribution (for example, measures the light intensity profile in a single measurement), and instantly measures a shadow position by creating the shadow on the light receiving unit 10 using a pattern. A quick two-dimensional measurement is available by repeating this measurement in the direction orthogonal to the arrangement direction L of the sensor photosensitive surface 21. The same light receiving unit 10 may be used for the two-dimensional measurement, or plural light receiving units 10 may be mounted for a dynamic range of the sensor.

The light receiving unit of this embodiment can effectively measure the light intensity in the one-dimensional direction in the immersion exposure apparatus that receives the light having an NA greater than one.

Referring now to FIG. 2, a description will be given of a light receiving unit 10A applicable instead of the light receiving unit 10. The light receiving unit 10A is different from the light receiving unit 10 in that the light receiving unit 10A has a fluorescent substance 11A thinner than the fluorescent substance 11. Here, FIG. 2 is a partially transparent, top plan view of the light receiving unit 10A, and omits the film 14, etc. For description purposes, FIG. 2 shows the light receiving pixels 22 by cutting the secondary light source formed by the substrate 12 and the fluorescent substance 11, facilitating understanding of a relative positional relationship.

A precise distribution measurement fails, if an electrical signal saturates due to the efficiency at which the photo detector package 20 converts the received light into the electrical signal and the original light intensity. One conceivable preventive measure is to insert a filter as a light attenuator in the light receiving element 10 and to reduce the light reaching the sensor photosensitive surface 21. This embodiment makes the width of the fluorescent substance 11A as a secondary light source forming part in a width direction S smaller than the width of each light receiving pixel 22, and adjusts the average value of the electrical signal strength from the light receiving pixels 22. The fluorescent substance 11A is as long as the overall length of the light receiving pixels 22 in the L direction.

An area of the fluorescent substance 11A is adjusted so that the S/N ratio of the signal level becomes optimal, and the maximum signal strength is equal to or less than the saturated signal strength. This embodiment forms the film 14 on the substrate 12 around the fluorescent substance 11, and precisely adjusts the signal strength.

This embodiment adjusts the incident light intensity through the area to a desired extinction ratio more easily than the light attenuator, such as an ND filter, and provides the high-performance photo detector unit 10, inexpensively.

Figure 3:
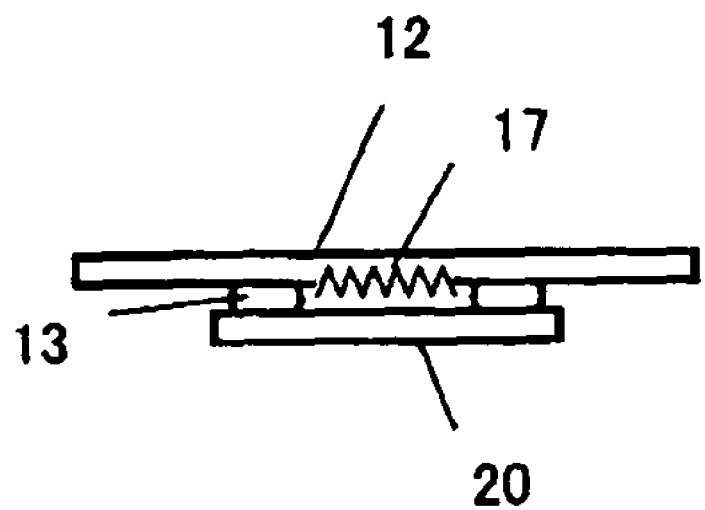
FIG. 3 is a schematic sectional view of another variation of the photo detector unit shown in FIGS. 1A to 1C.

FIG. 3 is a schematic sectional view of a photo detector unit 10B applicable instead of the photo detector unit 10. The photo detector unit 10B is different from the photo detector unit 10 in that the photo detector unit 10B has a diffusing surface 17 at part of the back surface of the substrate 12, instead of providing the fluorescent substance 11. While FIG. 3 partially forms the diffusing surface 17, the diffusing surface 17 may be formed on the entire back surface of the substrate 12, if there are no special limitations of the wiring patterns 15 and the bumps 13. The diffusing surface 17 may be lower or higher than the bump forming surface. Of course, if a projecting amount of the convex diffusing surface 17 exceeds the interval of the bump 13 to the sensor photosensitive surface 21, the diffusing surface 17 needs to be lower, to avoid damaging the photo detector package 20.

Figure 4:
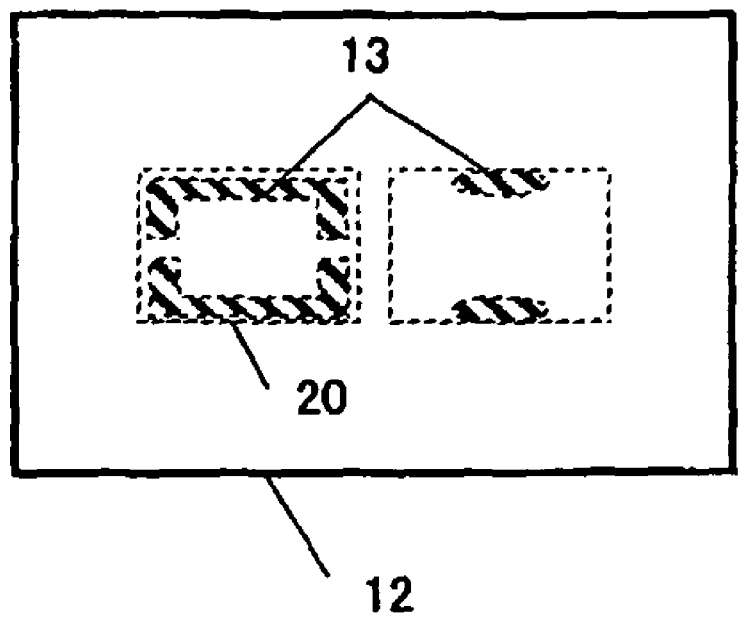
FIG. 4 is a schematic plan view of still another variation of the photo detector unit shown in FIGS. 1A to 1C.

Referring now to FIG. 4, a description will be given of a photo detector unit 10C applicable instead of the photo detector unit 10. FIG. 4 is a schematic transparent plan view of the photo detector unit 10C, and omits the fluorescent substance 11 and the film 14, for description purposes of the photo detector package 20 and the bumps 13. The photo detector unit 10C fixes a relatively small photodiode as the photo detector package 20 through the bumps 13.

The photo detector unit 10C changes and enlarges the shape of the bump 13, and increases the adhesion strength between the substrate 12 and the photo detector package 20. The photo detector unit 10C maintains the electrode arrangement of the photo detector package 20. The photo detector unit 10C can be implemented as a package. See package 25 in FIG. 5C, which will be described later. However, for example, in detecting the wavefront aberration of the projection optical system by arranging plural photo detectors in parallel, the photo detectors cannot be close to each other due to the thickness of the package. Accordingly, the embodiment in FIG. 4 provides the bump 13 with a package function, and omits the package 25 for the close arrangement of plural photo detector package 20. The photo detector unit 10C has two channels, or can provide intended measurements at two points. The left photo detector package 20 is illustratively enclosed by the bumps 13 at its circumference. The right photo detector package 20 is illustratively provided with a pair of parallel bumps 13. The package function does not require surrounding the bumps 13, as in the left bumps 13. The present invention does not limit the number of channels, and may use four or other channels.

The photo detector unit 10C uses a light blocking pattern (not shown) for various measurements. For example, it detects a three-dimensional light intensity peak by projecting a light distribution corresponding to the light shielding pattern, and searching for a peak of the light intensity. It is also used to detect a current unit position for two-dimensional positional measurements. Usually, plural patterns are mounted because of a small target measuring resolution, and a small pattern of the light blocking film. A different measurement is available when the light is selectively projected onto a target pattern.

Two photo detector packages 20 in the photo detector unit 10C can provide similar measurements. The two adjacent photo detector packages 20 measure at two distant points, and provide a final measurement result of various components, such as a rotating component and an inclination component, from the measurement result of the photo detector unit.

Figure 7:
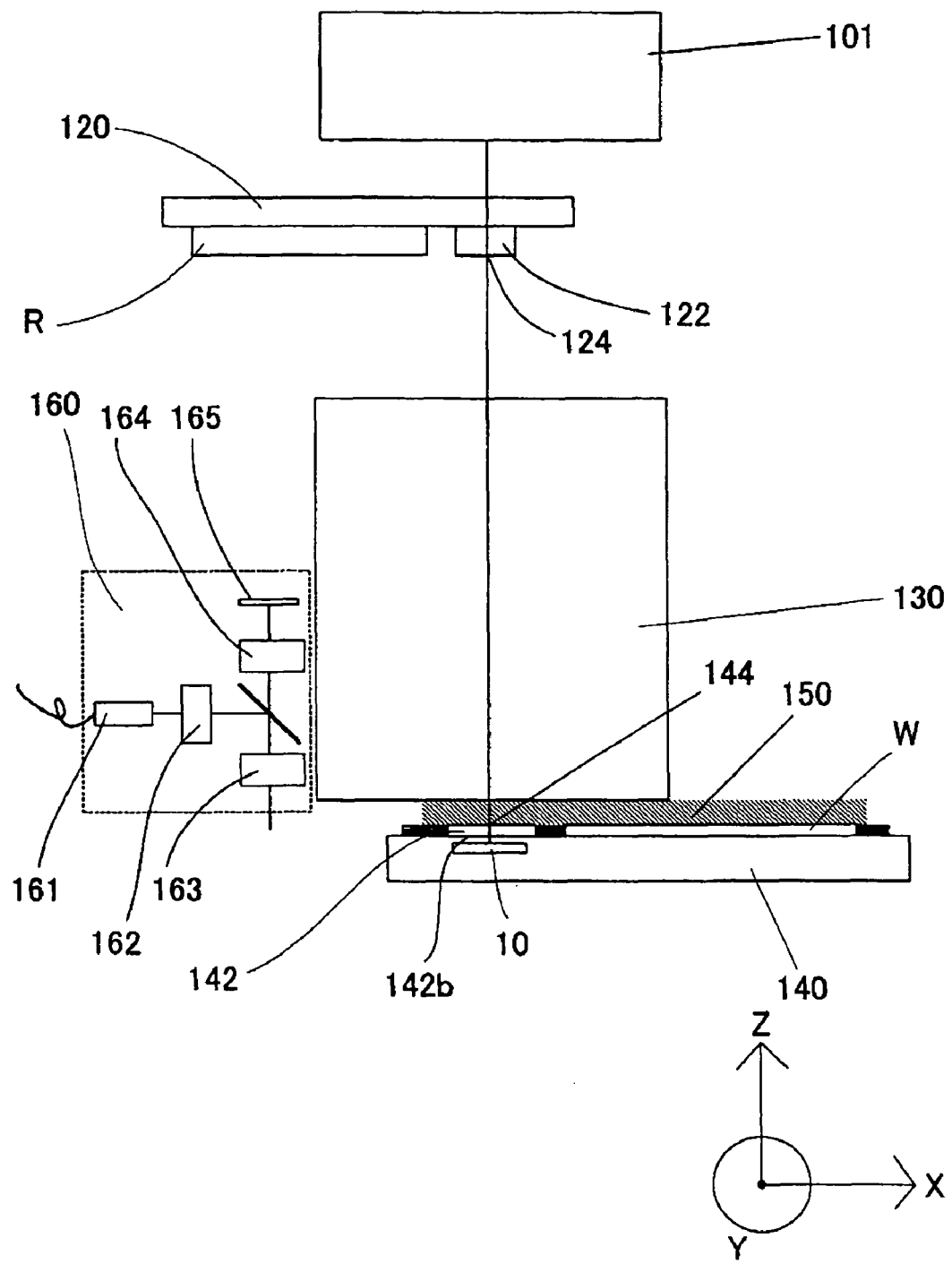
FIG. 7 is a schematic block diagram of another exposure apparatus to which the photo detector unit shown in FIGS. 1A to 1C is applicable.

Referring now to FIG. 7, a description will be given of another immersion exposure apparatus 100A. FIG. 7 shows a block diagram of the structure of the exposure apparatus 100A. The exposure apparatus 100A includes, as shown in FIG. 7, an illumination apparatus 101, a reticle stage 120, a projection optical system 130, a wafer stage 140, a liquid 150, an off-axis optical system 160, and a photo detector unit 10.

The exposure apparatus 100A disposes a wafer-side reference plate 142 on the wafer stage 140 and has, on its surface, a reference mark (reticle side pattern) 124 as a reference of the alignment between the reticle R and the wafer W. The liquid 150 is filled in a space between the wafer-side reference plate 142 and the projection optical system 130 (immersion). This structure uses the projection optical system 130 to maintain an imaging relationship between the reference mark (reticle side pattern) 124 and a wafer side pattern 144. This configuration can detect a positional relationship between the reticle side pattern 124 and the wafer side pattern 144 via the projection optical system 130 and the exposure light, which will be used for a calibration, such as a baseline measurement.

The illumination apparatus 101 includes a light source section and an illumination optical system. The illumination optical system is not limited to a configuration shown in FIG. 6, and includes a lens, a mirror, a light integrator, a stop, and the like. The light integrator may include a fly-eye lens or an integrator formed by stacking two sets of cylindrical lens array plates (or lenticular lenses), and can be replaced with an optical rod or a diffraction grating element. The illumination optical system can use any light regardless of whether it is axial or non-axial light.

The reticle R is made, for example, of quartz and has a circuit pattern (or an image) to be transferred. The reticle R is supported and driven by the reticle stage 120. The diffracted light from the pattern of the reticle R passes through the projection optical system 130 and is then projected onto the wafer W. The reticle R and the wafer W are located in an optically conjugate relationship. The exposure apparatus 100A is a scanner, and transfers the pattern on the reticle R onto the wafer W by scanning the reticle R and the wafer W. If it is a step-and-repeat exposure apparatus (referred to as a "stepper"), the reticle R and the wafer W remain stationary during exposure.

The reticle stage 120 supports the reticle R, is connected to a moving mechanism (not shown), and controls driving of the reticle R. The reticle stage 120 and the projection optical system 130 are installed on a barrel stool to a base frame placed on the floor, and the like, via a dampener, etc. The driving mechanism (not shown) includes, for example, a linear motor, and moves the reticle R in the XY directions by driving the reticle stage 120.

A reticle side reference plate (referred to as "R-side reference plate" hereinafter) 122 is fixed in place near the reticle R on the reticle stage 120, so that its pattern plane is approximately level with the pattern plane of the reticle R. Plural reticle side patterns 124 for alignment use are formed on the pattern plane of the R-side reference plate 122. The reticle side pattern is similar to the wafer side pattern 144.

The projection optical system 130 serves to image the diffracted light passing through the pattern of the reticle R onto the wafer W. The projection optical system 130 may use a dioptric optical system comprised solely of a plurality of lens elements, a catadioptric optical system, including a plurality of lens elements, and at least one concave mirror, etc.

The wafer W is a plate to be exposed, and a photoresist is applied on a substrate. The wafer W is a liquid crystal plate or another plate to be exposed in another embodiment. The wafer W is supported on the wafer stage 140.

The wafer stage 140 supports the wafer W, and controls driving of the wafer W. The wafer stage 140 uses a linear motor, and moves the wafer W in the XYZ directions. The reticle R and plate W are, for example, scanned synchronously, and the positions of the reticle stage 120 and the wafer stage 140 are monitored, for example, by a laser interferometer, and the like, so that both are driven at a constant speed ratio. The wafer stage 140 is installed on a stage stool supported on the floor, and the like, via a dampener, etc.

A wafer side reference plate (referred to as "W-side reference plate" hereinafter) 142 is fixed in place near the wafer W on the wafer stage 140, so that its pattern plane is approximately level with the top surface of wafer W (or imaging plane of the projection optical system 130).

Plural wafer side patterns 144 for alignment use are formed on the pattern plane of the W-side reference plate 142. The wafer side pattern 144 is a repetitive pattern of a light shielding part and a light transmitting part. In this embodiment, its critical dimension and pitch of each of the light shielding and transmitting parts is different from those of the reticle side pattern 124 by a magnification of the projection optical system 130.

The liquid 150 fills a space between the final plane of the projection optical system 130 and the wafer side pattern 144 on the W-side reference plate 142, and serves to maintain an imaging relationship via the projection optical system 130 between the reticle side pattern 124 and the wafer side patter 144.

In projection exposure of the pattern of the reticle R onto the wafer W, the exposure apparatus 100 needs to align the reticle R with the wafer W, and, thus, includes an alignment mechanism. The alignment mechanism includes a wafer alignment optical system, and a calibration system. The wafer alignment optical system detects the alignment mark on the wafer W (or the wafer side pattern 144 on the W-side reference plate 122) using an off-axis alignment optical system 160 different from the projection optical system 130. The calibration system detects a position of the wafer side pattern 144 on the wafer W (or the W-side reference plate 142 on the wafer stage 140), relative to the reticle side pattern 124 on the reticle R (or the R-side reference plate 122 on the reticle stage 120), via the projection optical system.

The off-axis alignment system 160 serves to detect a position of the wafer W, and includes an alignment light source (not shown), a fiber 161, an illumination part 162, an objective lens 163, a relay lens 164, and an image pickup device 165.

The off-axis alignment optical system 160 introduces the light having a non-exposure wavelength emitted from the alignment light source to the illumination part 162 via the fiber 161, and illuminates the alignment mark on the wafer W. The illuminated alignment mark is enlarged by the objective lens 163 and the relay lens 164, and is imaged on the image pickup device 165, such as a CCD. The off-axis alignment optical system 160 uses the fact that the image position on the image pickup device 165 changes as the alignment mark position changes, and can detect a position of the wafer W. However, the off-axis alignment optical system 160 provides an alignment for the wafer W at a position different from the exposure position, and cannot provide a precise alignment when a relationship (baseline) between the exposure position and the alignment position varies due to the environmental changes.

The calibration system provides a more precise alignment than the baseline stability, and serves to measure the baseline. First, the calibration system illuminates the reticle side pattern 124 on the R-side reference plate 122 (or the reticle R) with the exposure light from the illumination apparatus 110. A positional relationship is guaranteed between the reticle side pattern 124 and the reticle R on the reticle stage 120. Then, the calibration system projects the reticle side pattern 124 onto the wafer side pattern 144 on the W-side reference plate 142 installed on the wafer stage 140. This embodiment fills, in the liquid 150, the space between the projection optical system 130 and the wafer side pattern 144 (W-side reference plate 142), similar to the wafer W, and can form a clear image of the reticle side pattern 124 onto the wafer side pattern 144 on the W-side reference plate.

The photo detector unit 10, which receives the light transmitting the wafer side pattern 144, is provided at the back surface 142b side, on which the wafer side pattern 144 on the W-side reference plate 142 is formed.

The reticle side pattern 124 is projected onto the wafer side pattern 144 via the projection optical system, and the photo detector unit 10 detects the light that has transmitted through the wafer side pattern 144, while the wafer stage 140 is moved in the X direction. The light intensity becomes highest when the image of the reticle side pattern 124 accords with the position of the wafer side pattern 144. The exposure position of the reticle side pattern 124 can be precisely measured through the projection optical system 130.

Next, the wafer stage 140 moves, and the off-axis alignment optical system 160 detects a position of the wafer side pattern 144 on the W-side reference plate 142. Thereby, a positional relationship (baseline) can be calculated between the exposure position (reticle side pattern 124) and the off-axis alignment optical system 160. The pattern on the W-side reference plate 142 detected by the off-axis alignment optical system 160 may be either the wafer side pattern 144 or another pattern that has a guaranteed positional relationship with the wafer side pattern 144.

Thus, the reticle R is aligned with the wafer W by detecting the alignment mark on the wafer W via the off-axis alignment optical system 160 that has a positional relationship with the exposure position.

The calibration system aligns the image of the reticle side pattern 124 with the wafer side pattern 144 in the X-Y directions. In this state, the photo detector unit 10 obtains the intensity change of the light that has transmitted through the wafer side pattern 144 when the wafer stage 140 is moved in the optical axis direction of the projection optical system 130 (Z direction). The light intensity change becomes highest at the (best focus) position where the reticle side pattern 124 is focused on the wafer side pattern 144 (W-side reference plate 142). Therefore, a focal position of the projection optical system 130 can be detected.

Figure 8:
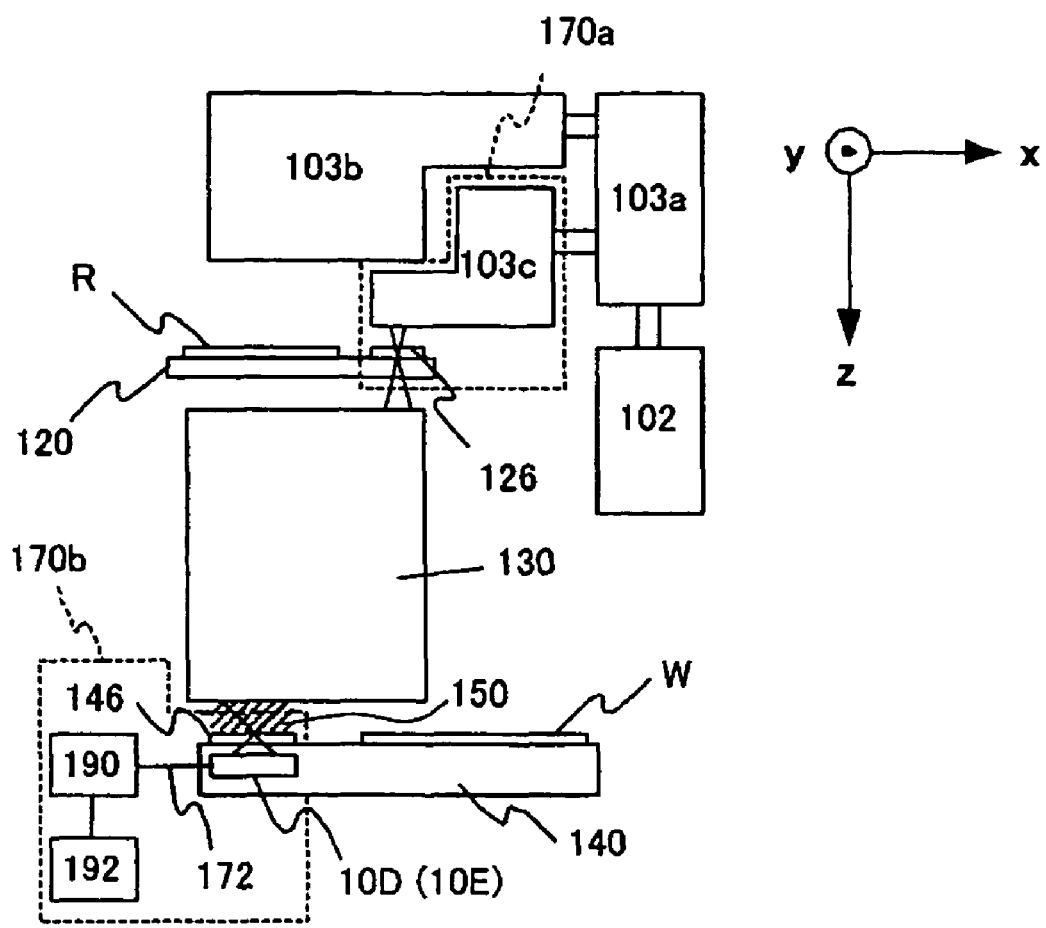
FIG. 8 is a schematic block diagram of still another exposure apparatus to which the photo detector unit shown in FIGS. 1A to 1C is applicable.

Referring now to FIG. 8, a description will be given of still another immersion exposure apparatus 100B. Here, FIG. 8 is a schematic block diagram of the exposure apparatus 100B. The exposure apparatus 100B includes an illumination apparatus, an alignment optical system 103c, the reticle R, the projection optical system 130, the wafer W, and measuring apparatuses (170a, 170b).

The illumination apparatus includes a light source section 102, and an illumination optical system. The illumination optical system includes a deflecting optical system 103a, and a first illumination optical system 103b. The illumination optical system 103a deflects the light from the light source section 102, and introduces the light to the first and second illumination optical systems 103b and 103c. The first illumination optical system 103b is an optical system that illuminates the reticle R, and includes various optical elements, such as a condenser lens, a fly-eye lens, an aperture stop, a condenser lens, a slit, and an imaging optical system, in this order.

The alignment optical system 103c serves as a second illumination optical system that illuminates masks (which is first and second masks 126 and 146, which will be described later) used for the measuring apparatuses (170a, 170b). The alignment optical system 103c serves as part of the alignment scope, and as part of the measuring apparatuses (170a, 170b). The second illumination optical system 103c is arranged outside the optical path during normal exposure, and FIG. 8 omits the driving mechanism that drives the alignment optical system 103c. The alignment scope also provides an alignment with the wafer stage 140 by forming an image of the alignment mark (not shown) on the mask stage onto the alignment mark on the wafer stage 140 via the projection optical system 130.

The measuring apparatuses (170a, 170b) include the alignment optical system (second illumination optical system) 103c, which includes a diffraction grating (light splitting means), a first mask 126, a second mask 146, image taking means 10D or 10E, communication cable 172, the controller 190, and the memory 192. The first and second masks 126 and 146 include pairs of slits and windows arranged at 0° and 90°. In this embodiment, the measuring apparatuses (170a, 170b) include an interferometer that measures the optical performance of the projection optical system 130 as a target optical system by detecting an interferogram (interference fringes) or interference pattern, and the interferometer uses an LDI. However, the measuring apparatuses (170a, 170b) may use an LSI.

The image taking means 10D or 10E is a photoelectric converting element, such as a CCD, and detects an interferogram between two lights. The cable 172 connects the image taking means 10D or 10E to the controller 190, so that they can communicate with each other. The controller 190 obtains phase information from an output from the image taking means 10D or 10E.

Figure 5A:
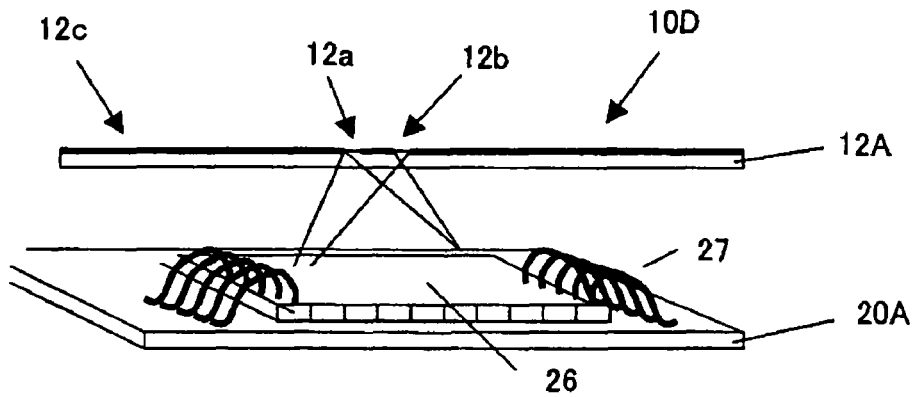
FIGS. 5A-5C are schematic sectional views of still another variation in a plan view of the photo detector unit shown in FIG. 2.
Figure 5B:
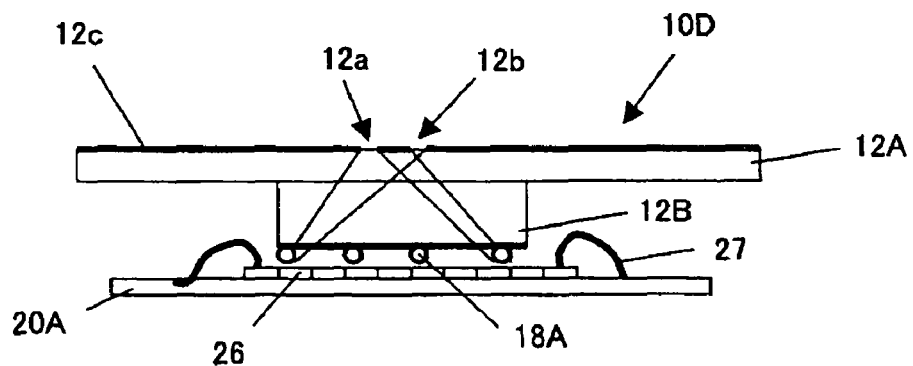
Figure 5C:
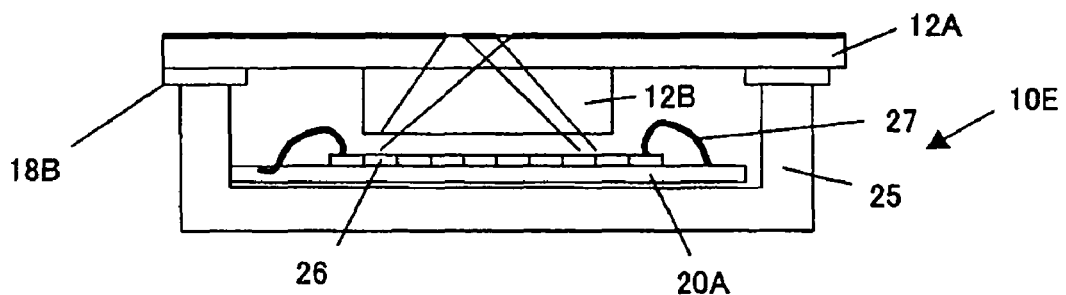

Referring now to FIGS. 5A to 5C, a description will be given of the photo detector units 10D and 10E. Here, FIG. 5A is a schematic perspective view for explaining a principle of the photo detector unit 10D. FIG. 5B is a schematic sectional view of the photo detector unit 10D. FIG. 5C is a schematic sectional view of the photo detector unit 10E.

The photo detector unit 10D or 10E includes a substrate 12A and 12B, photo detector package 20A, and spacers 18A and 18B, instead of the bumps 13. The substrate 12A and 12B may be integrally formed.

The substrate 12A has openings 12a and 12b and light shielding part 12c in the light incident plane, and corresponds to the second mask 146 in FIG. 8. Therefore, while FIG. 8 separates the second mask 146 from the photo detector unit 10D for description purposes, they are integrated in FIGS. 5A to 5C. The patterns of the openings 12a and 12b and the light shielding part 12c correspond to the pattern of the second mask 146 in this embodiment. The photo detector package 20A has a CCD 26, which is a sensor to observe an image of an interferogram formed by the light that has passed the openings 12a and 12b.

In order to observe the interferogram, it is necessary to form an interferogram having a size suitable for the spatial resolution of the CCD 26. It is, therefore, necessary to maintain a distance, such as several millimeters (e.g., 2 mm), from a mark pattern to a position at which the interferogram is observed. Accordingly, as shown in FIG. 5B, this embodiment provides the substrate 12B made of a light transmitting material under the substrate 12A. A connection between the substrates 12A and 12B preferably uses an approach that does not use the adhesive agent, such as an optical contact, because a wavelength of the exposure light for the exposure apparatus is so short that it is very difficult to find an adhesive agent that has both sufficient transmittance and sufficient durability. The bottom surface of the substrate 12B is a forming part of the secondary light source. The optical element, which includes the substrates 12A and 12B, may be one integrated substrate or a combination of plural substrates.

When the CCD 26 is used, the number of signal lines increases. A bump connection is not practical in view of the economic efficiency, etc., and a bonding wire 27 is used for a signal line as in the conventional package. The spacer 18A may be grains having an equal standard grain size, and inserted between the substrate 12B and the CCD 26, so as to adjust a distance between them. The spacer 18A prevents contact and short circuits between the bottom surface of the substrate 12B and the CCD 26. For efficient acquisition of the spatial information, the spacer 18A should be as small as possible. When the package (not shown) of the CCD 26 is adhered to the substrate 12A by the adhesive agent, etc., the gap between the bottom surface of the substrate 12B and the sensor photosensitive surface of the CCD 26 is determined by the size of the spacer 18A. The gap is maintained constant even when the adhesive agent contracts during hardening.

FIG. 10C is a schematic sectional view showing a photo detector unit 10E. The photo detector unit 10E interposes the sheet spacer 18B between the substrate 12A and the package 25, and maintains the gap between the bottom surface of the substrate 12B and the sensor photosensitive surface of the CCD 26. The spacer 18B prevents contact between the substrate 12B and the CCD 26, and prevents mechanical deterioration of the sensing characteristic.

The photo detector units 10D and 10E may omit the package 25 by providing the spacer or bumps 13 between the photo detector package 20A and the substrate 12A, as in the photo detector unit 10C shown in FIG. 4.

The measuring apparatuses (101a, 101b) initially measure the x-direction wavefront aberration of the projection optical system 130. It is obtained from phase information that is obtained from the interferogram observed by the image taking means 10D or 10E. A fringe scan method or an electronic moiré method may be used to calculate the phase information from the interferogram, by driving the diffraction grating. Next there follows a measurement of the y-direction wavefront aberration of the projection optical system 130. Next, the controller 190 synthesizes the x-direction and y-direction wavefront aberrations of the projection optical system 130 into the wavefront aberration of the projection optical system 130, which has a correct relative relationship in the two-dimensional direction.

The photo detector units 10A to 10E (collectively referred to as "photo detector unit 10") measure a predetermined physical quantity, and the controller 190 obtains, based on the result, predetermined optical information, such as the wavefront aberration of the projection optical system, the exposure dose, the light intensity distribution, and performs necessary adjustments for the light source section 102 and various optical systems. After the necessary adjustments, the exposure apparatus 100 to 100B (collectively referred to as "exposure apparatus 100") performs exposure.

In exposure, the light emitted from the light source section 102 enters the illumination optical system, which in turn illuminates the reticle R uniformly. The light that passes the reticle R is projected onto the wafer W at a predetermined magnification via the projection optical system 130. Since the exposure apparatus 100 is a scanner, the projection optical system 130 is fixed, and the reticle R and the wafer W are synchronously scanned to expose the entire shots. In addition, the wafer stage 140 is stepped to the next shot for a new scanning operation. The scanning and stepping are repeated to expose plural shots on the wafer W.

Since the final plane of the projection optical system 130 is immersed in the liquid 150 having a higher refractive index than that of air, the NA of the projection optical system 130 becomes higher, and the resolution becomes finer on the wafer W. The exposure apparatus 100 performs necessary adjustments based on the detection result of the photo detector unit 10, and exposes the wafer W with improved overlay accuracy with reduced aberration, resolution and throughput.

Thereby, the exposure apparatus 100 precisely transfers a pattern onto the resist, and provides high-quality devices, such as a semiconductor device, an LCD device, an image pickup device (such as a CCD), and a thin-film magnetic head.

Figure 9:
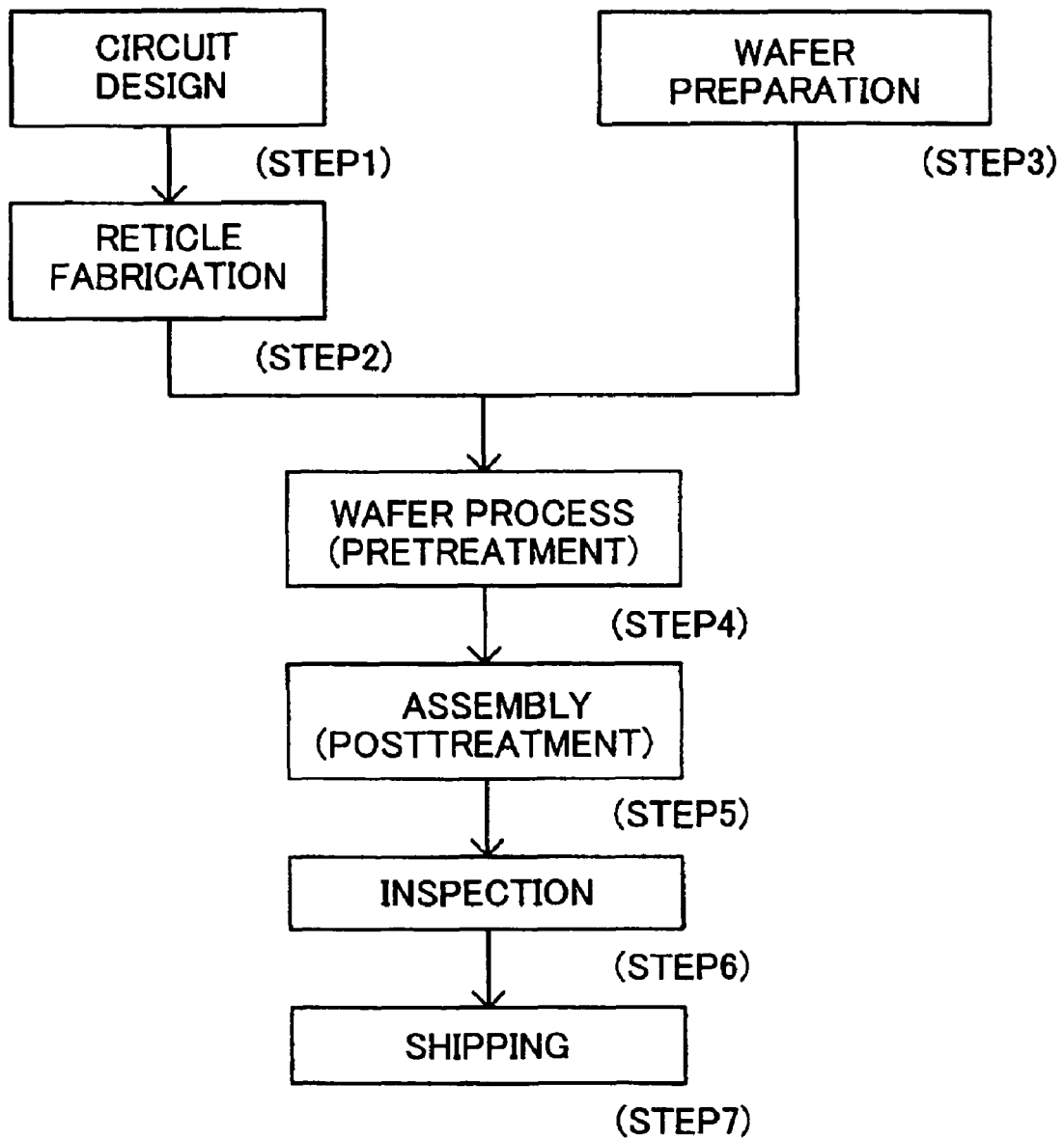
FIG. 9 is a flowchart for explaining fabrication of devices (e.g., semiconductor chips, such as ICs, LSIs, and the like, LCDs, CCDs, etc.).
Figure 10:
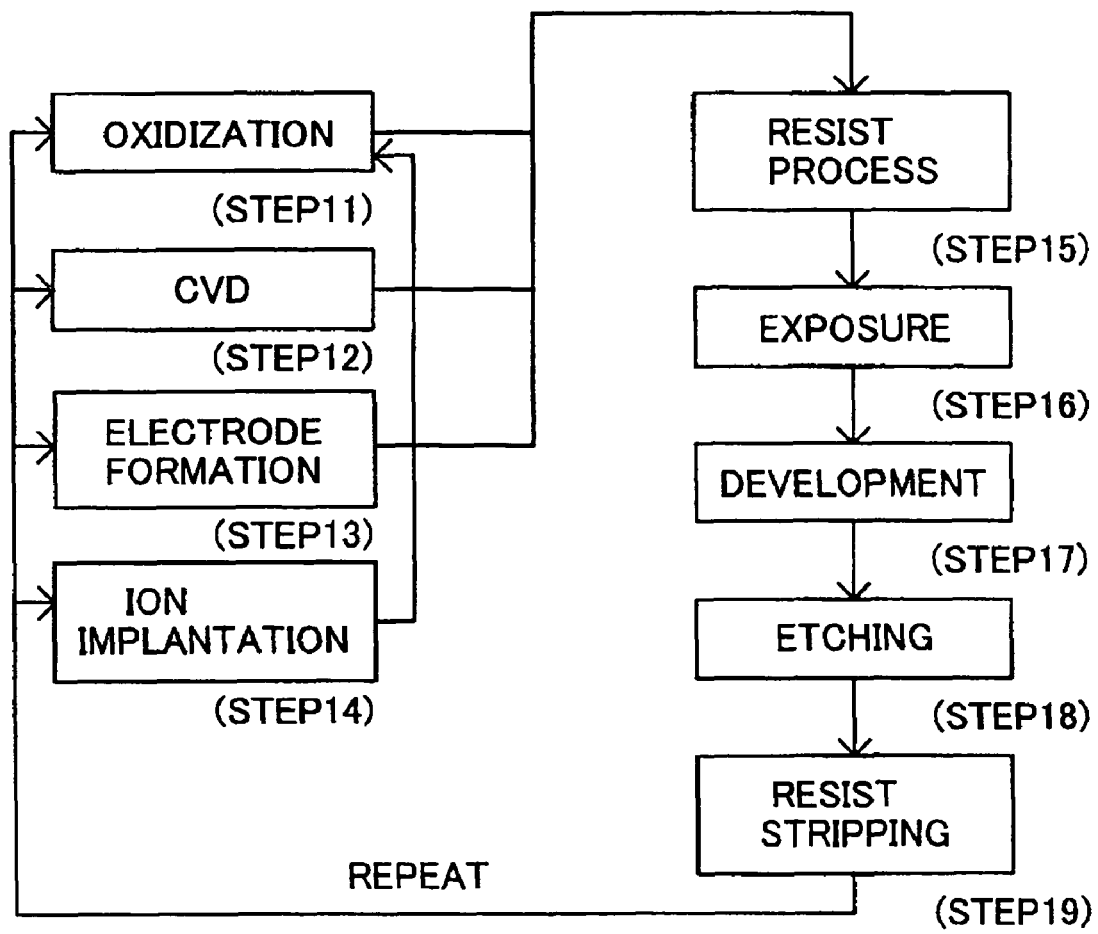
FIG. 10 is a flowchart for a wafer process shown in FIG. 9.

Referring now to FIGS. 9 and 10, a description will be given of an embodiment of a device manufacturing method using exposure apparatus 100 discussed above. FIG. 9 is a flowchart for explaining fabrication of a semiconductor device (e.g., semiconductor chips, such as ICs and LSIs, LCDs, CCDs, etc.). Step 1 (circuit design) designs a device circuit. Step 2 (reticle fabrication) forms a reticle having a designed circuit pattern. Step 3 (wafer preparation) manufactures a wafer using materials such as silicon. Step 4 (wafer process), which is referred to as a pre-treatment, forms actual circuitry on the wafer through a lithography technique using the reticle and wafer. Step 5 (assembly), which is also referred to as a post-treatment, forms, into a semiconductor chip, the wafer formed in Step 4, and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process shown in Step 4 in FIG. 9. Step 11 (oxidation) oxidizes the surface of the wafer. Step 12 (CVD) forms an insulating film on the surface of the wafer. Step 13 (electrode formation) forms electrodes on the wafer by vapor disposition, and the like. Step 14 (ion implantation) implants ions into the wafer. Step 15 (resist process) applies a photosensitive material onto the wafer. Step 16 (exposure) uses the exposure apparatus 100 to expose a reticle pattern onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. Use of this device manufacturing method enables the production of high-resolution devices (such as a semiconductor device, an LCD device, an image pickup device (such as a CCD), and a thin-film magnetic head), which have been difficult to manufacture. The device manufacturing method that uses the exposure apparatus 100, and devices as resultant products (both intermediate and final products) constitute aspects of the present invention.

Further, the present invention is not limited to these preferred embodiments, and various variations and modifications may be made without departing from the scope of the present invention.

What is claimed is:

1. An exposure apparatus which exposes a pattern on a mask onto an object by relatively scanning the object and the mask in a scanning direction, said exposure apparatus comprising:
   (a) a projection optical system configured to project a reticle pattern onto a plate by using light from a light source; and
   (b) a photo detector unit configured to detect the light projected by said projection optical system, wherein said photo detector unit includes:
      (i) a fluorescent substance that emits a fluorescence in accordance with an intensity of light;
      (ii) a substrate, which is patterned with a wiring pattern, and is configured to transmit the light and to introduce the light to said fluorescent substance;
      (iii) a plurality of detectors configured to detect the fluorescence, said plurality of detectors being arranged in the scanning direction;
      (iv) an absorber film that absorbs light reflected by each of said plurality of the detectors; and
      (v) plurality of bumps configured to space said fluorescent substance from said plurality of detectors, and to electrically connect said plurality of detectors and the wiring pattern of said substrate,
   wherein a width of said fluorescent substance is smaller than a width of said plurality of detectors, in a direction perpendicular to the scanning direction.

2. An exposure apparatus according to claim 1, wherein each of said plurality of bumps is arranged at one side of each of said plurality of detectors, and the side, at which each of said bumps is arranged, alternates with respect to said plurality of detectors.

3. A device manufacturing method comprising the steps of:
   (A) exposing a substrate using an exposure apparatus which exposes a pattern on a mask onto an object by relatively scanning the object and the mask in a scanning direction; and
   (B) developing the exposed substrate,
   wherein the exposure apparatus comprises:
      (a) a projection optical system configured to project a reticle pattern onto a plate by using light from a light source; and
      (b) a photo detector unit configured to detect the light projected by the projection optical system, wherein the photo detector unit includes:
         (i) a fluorescent substance that emits fluorescence in accordance with an intensity of light;
         (ii) a substrate, which is patterned with a wiring pattern, and is configured to transmit the light and to introduce the light to the fluorescent substance;
         (iii) a plurality of detectors configured to detect the fluorescence, the plurality of detectors being arranged in the scanning direction;
         (iv) an absorber film that absorbs light reflected by each of the plurality of the detectors; and
         (v) a plurality of bumps configured to space the fluorescent substance from the plurality of detectors, and to electrically connect the plurality of detectors and the wiring pattern of the substrate,
      wherein a width of the fluorescent substance is smaller than a width of the plurality of detectors, in a direction perpendicular to the scanning direction.

4. An exposure apparatus which exposes a pattern on a mask to an object by relatively scanning the object and the mask in a scanning direction, said exposure apparatus comprising:
   (a) a projection optical system configured to project a reticle pattern onto a plate by using light from a light source; and
   (b) a photo detector unit configured to detect the light projected by said projection optical system, wherein said photo detector unit includes:
      (i) a diffuser configured to diffuse the light;
      (ii) a substrate, which is patterned with a wiring pattern, and is configured to transmit the light and to introduce the light to said diffuser;
      (iii) a plurality of detectors configured to detect the light that has been diffused by said diffuser, said plurality of detectors being arranged in parallel;
      (iv) an absorber film that absorbs light reflected by each of said plurality of detectors; and (v) a plurality of bumps configured to space said diffuser from said plurality of detectors, and to electrically connect said plurality of detectors and the wiring pattern of said substrate, wherein a width of said diffuser is smaller than a width of each of said plurality of detectors, in a direction perpendicular to the scanning direction.

5. An exposure apparatus according to claim 4, wherein each of said plurality of bumps is arranged at one side of each of said plurality of detectors, and the side, at which each of said bumps is arranged, alternates with respect to said plurality of detectors.

6. A device manufacturing method comprising the steps of:
(A) exposing a substrate using an exposure apparatus which exposes a pattern on a mask onto an object by relatively scanning the object and the mask in a scanning direction; and
(B) developing the exposed substrate,
wherein the exposure apparatus comprises:
    (a) a projection optical system configured to project a reticle pattern onto a plate by using light from a light source; and
    (b) a photo detector unit configured to detect the light projected by the projection optical system, wherein the photo detector unit includes:
        (i) a diffuser configured to diffuse the light;
        (ii) a substrate, which is patterned with a wiring pattern, and is configured to transmit the light and to introduce the light to the diffuser;
        (iii) a plurality of detectors configured to detect the light that has been diffused by the diffuser, the plurality of detectors being arranged in parallel;
        (iv) an absorber film that absorbs light reflected by each of the plurality of detectors; and
        (v) a plurality of bumps configured to space the diffuser from the plurality of detectors, and to electrically connect the plurality of detectors and the wiring pattern of the substrate,
    wherein a width of the diffuser is smaller than a width of each of the plurality of detectors, in a direction perpendicular to the scanning direction.

* * * * *